United States Patent
Kawamura et al.

(10) Patent No.: US 8,810,678 B2
(45) Date of Patent: Aug. 19, 2014

(54) IMAGING APPARATUS AND METHOD OF DRIVING SOLID-STATE IMAGING DEVICE

(71) Applicant: FUJIFILM Coporation, Tokyo (JP)

(72) Inventors: Noriko Kawamura, Saitama (JP); Tomoyuki Kawai, Saitama (JP); Seiji Tanaka, Saitama (JP); Tetsuro Ashida, Saitama (JP); Takehiro Kouguchi, Saitama (JP); Hisashi Endo, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 127 days.

(21) Appl. No.: 13/655,576

(22) Filed: Oct. 19, 2012

(65) Prior Publication Data

US 2013/0038767 A1  Feb. 14, 2013

Related U.S. Application Data

(63) Continuation of application No. PCT/JP2011/059430, filed on Apr. 15, 2011.

(30) Foreign Application Priority Data

Apr. 20, 2010  (JP) .................................. 2010-097366

(51) Int. Cl.
*H04N 5/228* (2006.01)
*H04N 5/235* (2006.01)
*H04N 5/335* (2011.01)

(52) U.S. Cl.
USPC ...................... 348/222.1; 348/221.1; 348/273

(58) Field of Classification Search
CPC .................. H01L 27/14601; H01L 27/14621; H01L 27/14843; H04N 5/23245; H04N 5/347; H04N 5/3535; H04N 5/35563; H04N 9/045

USPC ............. 348/158, 221.1, 222.1, 223.1, 229.1, 348/273, 294

See application file for complete search history.

(56) References Cited

U.S. PATENT DOCUMENTS

| 7,538,794 B2 * | 5/2009 | Turley et al. ................ 348/208.1 |
| 7,986,360 B2 * | 7/2011 | Mitsunaga et al. ........... 348/273 |
| 2004/0262493 A1 | 12/2004 | Suzuki |

(Continued)

FOREIGN PATENT DOCUMENTS

| JP | 2004-289728 A | 10/2004 |
| JP | 2004-336469 A | 11/2004 |

(Continued)

*Primary Examiner* — Trung Diep (74) *Attorney, Agent, or Firm* — Birch, Stewart, Kolasch & Birch, LLP (57) ABSTRACT

An imaging apparatus includes a solid-state imaging device and a driving unit. The solid-state imaging device has a plurality of pairs of first and second photoelectric conversion elements having different spectral sensitivity characteristics. The driving unit independently controls an exposure time of a first group of the plurality of first photoelectric conversion elements and an exposure time of a second group of the plurality of second photoelectric conversion elements. A wavelength range where the first photoelectric conversion element of each pair mainly has a spectral sensitivity and a wavelength range where the second photoelectric conversion element of each pair mainly has spectral sensitivity fall within the respective wavelength ranges of specific colors of visible light. A half width in the spectral sensitivity characteristic of each first photoelectric conversion element is wider than a half width in the spectral sensitivity characteristic of each second photoelectric conversion element of the pair.

10 Claims, 7 Drawing Sheets

(56) References Cited

U.S. PATENT DOCUMENTS

2005/0230774 A1    10/2005   Suzuki
2009/0147125 A1*    6/2009   Muraki et al. ............... 348/345
2009/0244329 A1*   10/2009   Kuniba ......................... 348/241
2009/0262215 A1*   10/2009   Sano et al. ................ 348/229.1

FOREIGN PATENT DOCUMENTS

| JP | 2005-72966 A | 3/2005 |
| JP | 2008-270832 A | 11/2008 |
| JP | 2009-268078 A | 11/2009 |

* cited by examiner

IMAGING APPARATUS AND METHOD OF DRIVING SOLID-STATE IMAGING DEVICE

CROSS-REFERENCE TO RELATED APPLICATIONS

This non-provisional application is a Continuation of International Application No. PCT/JP2011/059430 filed on Apr. 15, 2011, which claims the benefit of Japanese Patent Application No. 2010-097366 filed in Japan on Apr. 20, 2010. The entire contents of all of the above applications are hereby incorporated by reference.

TECHNICAL FIELD

The present invention relates to an imaging apparatus and a method of driving a solid-state imaging device.

BACKGROUND ART

Up to now, various imaging apparatuses which are equipped with a solid-state imaging device having pairs of two photoelectric conversion elements have been suggested, where the two photoelectric conversion elements obtain signals with different sensitivities to expand a dynamic range (a D range) (e.g., see Patent Documents 1 to 3).

An imaging apparatus disclosed in Patent Document 1 has a solid-state imaging device that includes pairs of pixel sections, each pair having two photoelectric conversion elements, which have red color filters different in wavelength selectivity provided thereabove, respectively, pairs of pixel sections, each pair having two photoelectric conversion elements, which have green color filters different in wavelength selectivity, respectively provided thereabove, and pairs of pixel sections, each pair having two photoelectric conversion elements, which have blue color filters different in wavelength selectivity provided thereabove, respectively. Thus, an improvement in color reproducibility is realized by combining signals obtained from the two photoelectric conversion elements of each pair of pixel sections are combined. Furthermore, the dynamic range can also be expanded by providing a sensitivity difference between the two photoelectric conversion elements of each pair of pixel sections (by changing a structure or an exposure time in the two photoelectric conversion elements).

In the solid-state imaging device having the configuration disclosed in Patent Document 1, when the quality of image is taken into consideration, it would be necessary to review which one of the two photoelectric conversion elements should be made to have a higher sensitivity in each pair of pixel sections. However, Patent Document 1 does not describe a specific example for the case in which the sensitivity difference is provided between the two photoelectric conversion elements of each pair of pixel sections.

In Patent Document 2, a solid-state imaging device that holds color filters having different spectral characteristics on an upper side thereof and includes primary and secondary photosensitive sections whose light-receiving areas are different from each other is disclosed. With this solid-state imaging device, it is also possible to expand a dynamic range.

However, Patent Document 2 is mainly directed to an improvement in discrimination precision of an illuminating light source, and does not describe color reproducibility.

In Patent Document 3, a solid-state imaging device that have a plurality of pairs of two photoelectric conversion elements, which are equal to or different from each other in photoelectric conversion sensitivity is disclosed. However, only the expansion of a dynamic range is mentioned, but the improvement of color reproducibility is not described.

PRIOR ART DOCUMENT

Patent Literature

[Patent Document 1] JP-2009-268078 A
[Patent Document 2] JP-2004-289728 A
[Patent Document 3] JP-2008-270832 A

SUMMARY OF THE INVENTION

Problems to be Solved

The present invention has been made taking the above-described status into consideration, and an object of the present invention is to provide an imaging apparatus and a method of driving a solid-state imaging device which are capable of achieving the improvement of color reproducibility and the expansion of a dynamic range regardless of a subject compatibly.

Means for Solving the Problems

An imaging apparatus of the present invention includes: a solid-state imaging device having a plurality of pairs of first and second photoelectric conversion elements having different spectral sensitivity characteristics; and a driving unit that independently controls exposure time of a first group made up of the plurality of first photoelectric conversion elements and exposure time of a second group made up of the plurality of second photoelectric conversion elements, wherein a wavelength range where the first photoelectric conversion element of each pair mainly has spectral sensitivity and a wavelength range where the second photoelectric conversion element of each pair mainly has spectral sensitivity fall within the respective wavelength ranges of specific colors of visible light, the plurality of pairs include plural types of pairs having different specific colors, and the driving unit performs a control operation by switching first control in which the exposure time of the first group is longer than that of the second group and second control in which the exposure time of the second group is longer than that of the first group.

A method of driving a solid-state imaging device of the present invention is a method of driving a solid-state imaging device having a plurality of pairs, each of which includes first and second photoelectric conversion elements having different spectral sensitivity characteristics, wherein a wavelength range where the first photoelectric conversion element of each pair mainly has spectral sensitivity and a wavelength range where the second photoelectric conversion element of each pair mainly has spectral sensitivity fall within the respective wavelength ranges of specific colors of visible light, the plurality of pairs include a plurality of types of pairs having different specific colors, and the method includes a driving step of independently controlling exposure time of a first group made up of the plurality of first photoelectric conversion elements and exposure time of a second group made up of the plurality of second photoelectric conversion elements. In the driving step, a control operation is performed by switching first control in which the exposure time of the first group is longer than that of the second group and second control in which the exposure time of the second group is longer than that of the first group.

Effects of the Invention

According to the present invention, an imaging apparatus and a method of driving a solid-state imaging device, which are capable of achieving the improvement of color reproducibility and the expansion of a dynamic range regardless of a subject compatibly, can be provided.

DESCRIPTION OF THE PREFERRED EMBODIMENTS OF THE INVENTION

Hereinafter, embodiments of the present invention will be described with reference to the drawings.

Figure 1:
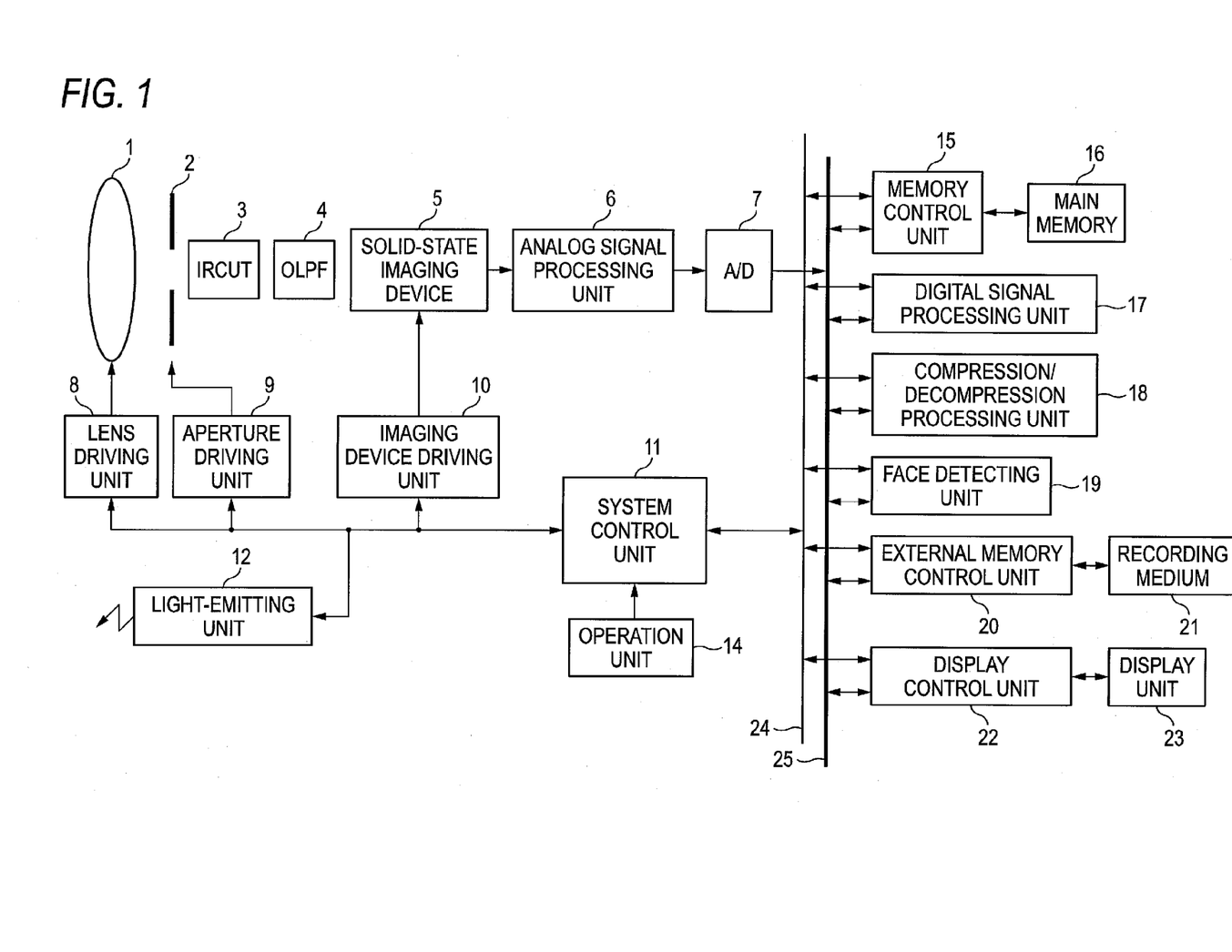
FIG. 1 is a view illustrating a schematic configuration of an imaging apparatus to describe one embodiment of the present invention.

FIG. 1 shows a schematic configuration of an imaging apparatus for describing an embodiment of the present invention. Examples of the imaging apparatus include an imaging apparatus, such as a digital camera and a digital television, an imaging module equipped in an electronic endoscope, a camera built-in mobile phone, etc. Here, a digital camera will be described by way of an example.

An imaging system of the shown digital camera includes a photographing lens 1, a CCD type solid-state imaging device 5, and a diaphragm 2, an infrared cut filter 3, and an optical low pass filter 4 installed between the photographing lens 1 and the solid-state imaging device 5. Further, a mechanical shutter (not shown) is installed in front of the photographing lens 1.

A system control unit 11, which controls an entire electrical control system of the digital camera overall, controls a flash light-emitting unit 12. Further, the system control unit 11 controls a lens driving unit 8 either to adjust a position of the photographing lens 1 to a focus position or to perform a zoom adjustment. In addition, the system control unit 11 controls an aperture size of the diaphragm 2 via a diaphragm driving unit 9 to adjust an amount of exposure.

Further, the system control unit 11 drives the solid-state imaging device 5 via an imaging device driving unit 10, and outputs an image of a subject imaged through the photographing lens 1 as an imaging signal. An instruction signal is input into the system control unit 11 from a user via an operation unit 14. The imaging device driving unit 10 also controls the opening/closing of the mechanical shutter.

The electrical control system of the digital camera further includes: an analog signal processing unit 6 that is connected to an output of the solid-state imaging device 5 and performs analog signal processing, such as correlated double sampling processing; and an analog/digital (A/D) conversion circuit 7 that converts RGB color signals output from the analog signal processing unit 6 into digital signals. The analog signal processing unit 6 and the A/D conversion circuit 7 are controlled by the system control unit 11.

Furthermore, the electrical control system of the digital camera includes: a main memory 16; a memory control unit 15 connected to the main memory 16; a digital signal processing unit 17 that performs interpolation operation, gamma correction operation, and RGB/YC conversion processing to generate image data; a compression/decompression processing unit 18 that compresses the image data generated by the digital signal processing unit 17 in Joint Photographic Experts Group (JPEG) format and decompresses the compressed image data; a face detecting unit 19 that detects a face from the image data obtained by imaging the face with the solid-state imaging device 5 by a face recognition processing; an external memory control unit 20 to which a detachable recording medium 21 is connected; and a display control unit 22 to which a liquid crystal display unit 23 mounted on, for instance, the rear side of the camera is connected. The memory control unit 15, the digital signal processing unit 17, the compression/decompression processing unit 18, the face detecting unit 19, the external memory control unit 20, and the display control unit 22 are mutually connected by a control bus 24 and a data bus 25, and are controlled by commands from the system control unit 11.

Figure 2:
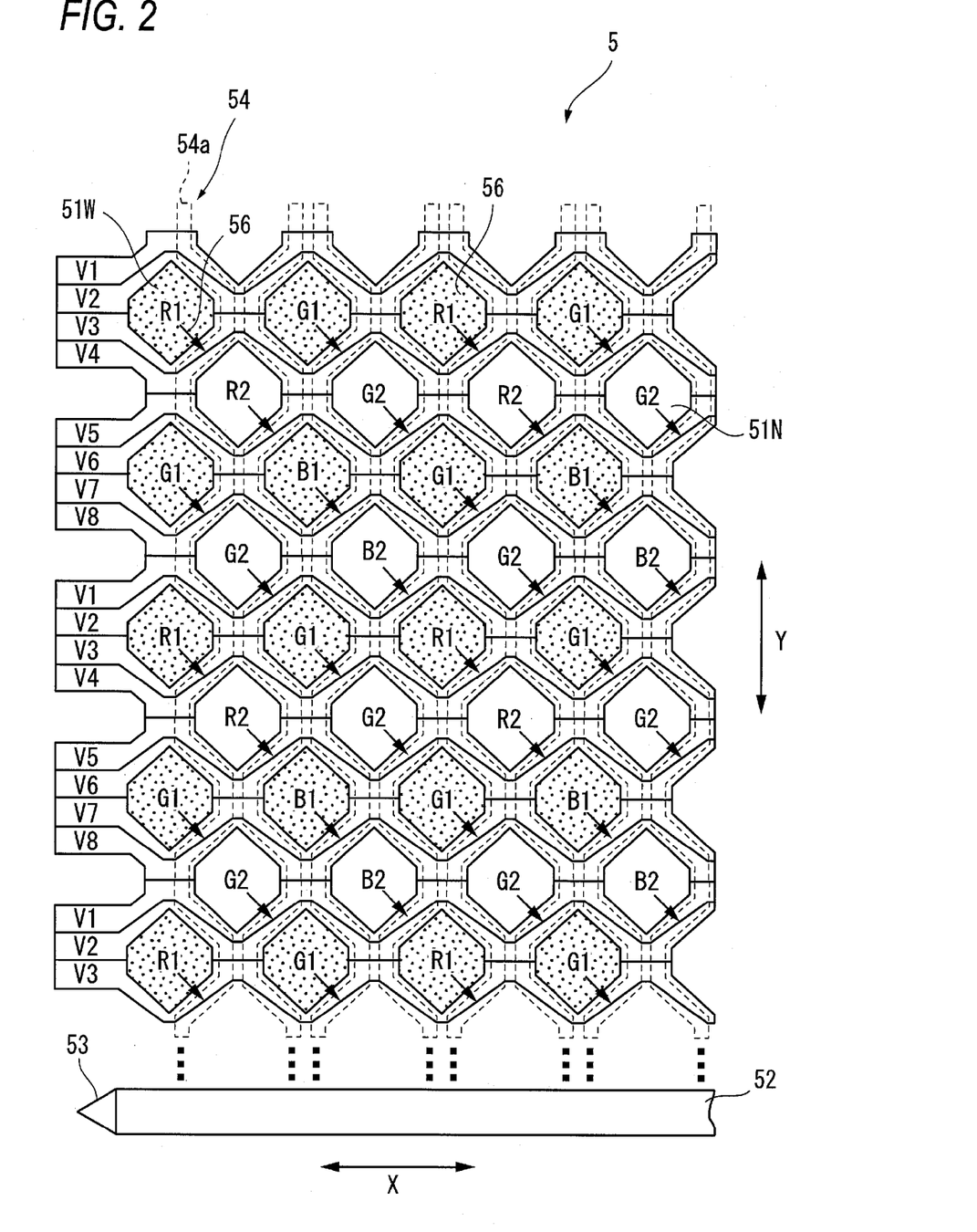
FIG. 2 is a plan view illustrating a schematic configuration of the solid-state imaging device in the digital camera shown in FIG. 1.

FIG. 2 is a schematic plan view illustrating an outline configuration of the solid-state imaging device 5 in the digital camera shown in FIG. 1.

As shown in FIG. 2, the solid-state imaging device 5 includes a first group made up of a plurality of photoelectric conversion elements 51W, a second group made up of a plurality of photoelectric conversion elements 51N, a plurality of vertical charge transfer units 54, a horizontal charge transfer unit 52, and an output unit 53.

All the photoelectric conversion elements included in the solid-state imaging device 5 are disposed in a two-dimensional shape in a column direction Y of a semiconductor substrate surface and in a row direction X intersecting the column direction (crossing at right angles in an example of FIG. 2). All the photoelectric conversion elements have first photoelectric conversion element lines made up of the plurality of photoelectric conversion elements 51W arranged in parallel in the column direction Y, and second photoelectric conversion element lines made up of the plurality of photoelectric conversion elements 51N arranged in parallel in the column direction Y. Thus, the first photoelectric conversion element lines and the second photoelectric conversion element lines are arranged in parallel with a constant pitch in the row direction X. Furthermore, the first photoelectric conversion element lines are disposed to be shifted relative to the second photoelectric conversion element lines in the column direction Y by ½ of the array pitch of the photoelectric conversion elements of each photoelectric conversion element line in the column direction Y. This array may be obtained by disposing the photoelectric conversion elements 51N at positions offset in an inclined direction of 45° with respect to the respective photoelectric conversion elements 51W disposed in a square lattice shape.

In this way, the photoelectric conversion elements 51N are disposed adjacent to the respective photoelectric conversion elements 51W in the same positional relationship (same direction) with respect to the respective photoelectric conversion elements 51W. Thus, each photoelectric conversion element 51W and a photoelectric conversion element 51N adjoining each photoelectric conversion element 51W in the same positional relationship form a pair.

All the photoelectric conversion elements included in the solid-state imaging device 5 have approximately the same configuration (the same design value). The term "approximately the same configuration" refers that photoelectric conversion regions (photodiodes) formed within a semiconductor substrate have approximately the same size, and that light-shielding films formed above the photoelectric conversion regions have approximately the same opening size.

The first group made up of the photoelectric conversion elements 51W and the second group made up of the photoelectric conversion elements 51N are configured such that the exposure time of each of the first and second groups can be independently controlled. In the digital camera, the imaging device driving unit 10 performs a control to render the exposure time of the first group and the exposure time of the second group to be different from each other. As such, respective signals with different sensitivities are obtained from the first group of photoelectric conversion elements 51W and the second group of photoelectric conversion elements 51N.

In the solid-state imaging device 5, the photoelectric conversion elements 51W and the photoelectric conversion elements 51N forming pairs meet the following conditions.

(1) Spectral sensitivity characteristics are different from each other.

(2) A wavelength range where the photoelectric conversion elements 51W mainly have a spectral sensitivity and a wavelength range where the photoelectric conversion elements 51N mainly have a spectral sensitivity (e.g., a half width in the spectral sensitivity characteristic of the photoelectric conversion elements 51N) fall within wavelength ranges of lights of specific colors in visible light.

(3) The half width in the spectral sensitivity characteristic of the photoelectric conversion elements 51N is narrower than that in the spectral sensitivity characteristic of the photoelectric conversion elements 51W.

(4) A value of the spectral sensitivity at each wavelength of the wavelength range where the photoelectric conversion elements 51W mainly have the spectral sensitivity is greater than that at each corresponding wavelength of the photoelectric conversion elements 51N.

(5) A ratio of a peak value of the spectral sensitivity of the photoelectric conversion elements 51W to the half width in the spectral sensitivity characteristic of the photoelectric conversion elements 51W (half width/peak value) is greater than a ratio of a peak value of the spectral sensitivity of the photoelectric conversion elements 51N to the half width in the spectral sensitivity characteristic of the photoelectric conversion elements 51N (half width/peak value).

Further, the wavelength range where the photoelectric conversion elements mainly have the spectral sensitivity means that most of the signals output from these photoelectric conversion elements are signals corresponding to light of this wavelength range, and indicates that signal components corresponding to light other than the wavelength range does not practically influence the colors of the signals output from these photoelectric conversion elements. Hereinafter, a half width in the spectral sensitivity characteristic of each photoelectric conversion element will be described as the wavelength range where the photoelectric conversion element mainly has the spectral sensitivity.

Several methods may be proposed as those for of differentiating the spectral sensitivity characteristics at the photoelectric conversion elements 51W and the photoelectric conversion elements 51N which form pairs. This solid-state imaging device 5 employs a method of differentiating the spectral sensitivity characteristics of the color filters installed above these elements.

Above each of the photoelectric conversion elements 51W, there is provided a color filter R1 for transmitting red light, a color filter G1 for transmitting green light, or a color filter B1 for transmitting blue light, which are disposed in a Bayer array as a whole.

In FIG. 2, the letter "R1" is given to the photoelectric conversion elements 51W above which the color filters R1 are installed. Further, the letter "G1" is given to the photoelectric conversion elements 51W above which the color filters G1 are installed. In addition, the letter "B1" is given to the photoelectric conversion elements 51W above which the color filters B1 are installed.

Above each of the photoelectric conversion elements 51N, there is provided a color filter R2 for transmitting red light, a color filter G2 for transmitting green light, and a color filter B2 for transmitting blue light, which are disposed in a Bayer array as a whole.

In FIG. 2, the letter "R2" is given to the photoelectric conversion elements 51N above which the color filters R2 are installed. Further, the letter "G2" is given to the photoelectric conversion elements 51N above which the color filters G2 are installed. In addition, the letter "B2" is given to the photoelectric conversion elements 51N above which the color filters B2 are installed.

In the following description, a color filter R1 and a color filter R2 are also collectively called a red filter; a color filter G1 and a color filter G2 are also collectively called a green filter; and a color filter B1 and a color filter B2 are also collectively called a blue filter.

In this way, the same color filters (the red filters, the green filters, or the blue filters) are disposed above the respective photoelectric conversion elements 51W and photoelectric conversion elements 51N that form pairs. Accordingly, it may be said that three types of pairs that are different in the color of the filter installed on the upper side (R pairs having the red filter thereabove, G pairs having the green filter thereabove, and B pairs having the blue filter thereabove) are included in the solid-state imaging device 5.

In addition, the specific color in the above condition (2) for each of the photoelectric conversion elements of the R pairs is red. The specific color in the above condition (2) for each of the photoelectric conversion elements of the G pairs is green. The specific color in the above condition (2) for each of the photoelectric conversion elements of the B pairs is blue.

In the respective photoelectric conversion elements of the R pairs, the respective spectral sensitivity characteristics of the color filters R1 and the color filters R2 are differentiated, so that there is provided a difference in spectral sensitivity characteristic between the photoelectric conversion elements 51W and the photoelectric conversion elements 51N.

In the respective photoelectric conversion elements of the G pairs, the respective spectral sensitivity characteristics of the color filters G1 and the color filters G2 are differentiated, so that there is provided a difference in spectral sensitivity characteristic between the photoelectric conversion elements 51W and the photoelectric conversion elements 51N.

In the photoelectric conversion elements of the B pairs, the spectral sensitivity characteristics of the color filters B1 and the color filters B2 are differentiated, so that there is provided a difference in spectral sensitivity characteristic between the photoelectric conversion elements 51W and the photoelectric conversion elements 51N.

Hereinafter, specific examples of the spectral sensitivity characteristic of each of the photoelectric conversion elements of the R pairs, the photoelectric conversion elements of the G pairs, and the photoelectric conversion elements of the B pairs will be described.

Figure 3:
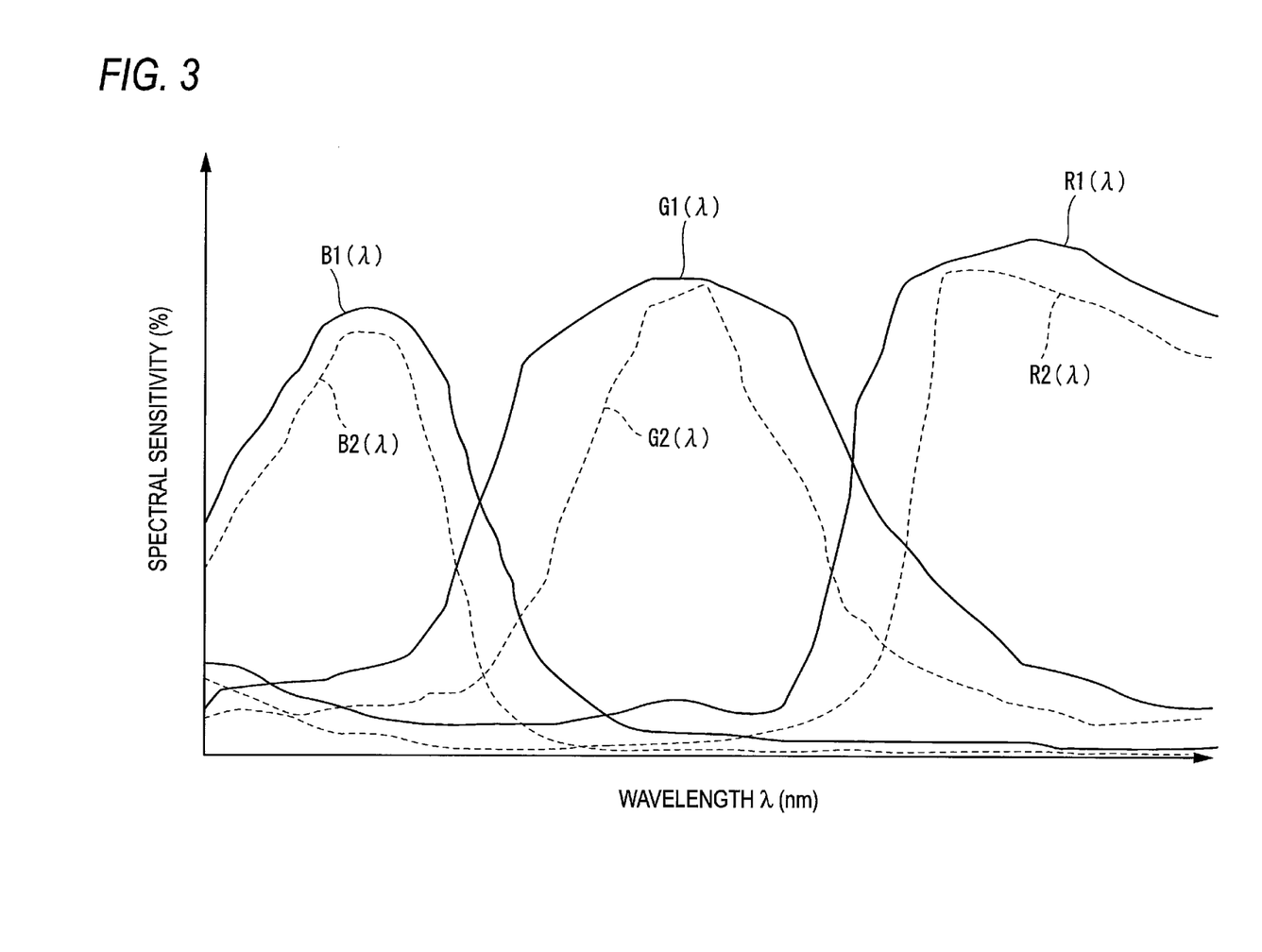
FIG. 3 is a diagram illustrating spectral sensitivity characteristics of the photoelectric conversion elements 51W and the photoelectric conversion elements 51N in the solid-state imaging device shown in FIG. 2.

FIG. 3 is a diagram showing the spectral sensitivity characteristics of the photoelectric conversion elements 51W and the photoelectric conversion elements 51N in the solid-state imaging device 5 shown in FIG. 2. In FIG. 3, the characteristics indicated by symbols $R1(\lambda)$, $G1(\lambda)$, and $B1(\lambda)$ exhibit the spectral sensitivity characteristics of the photoelectric conversion elements 51W which are provided with the color filters R1, G1, and B1, respectively. Further, the characteristics indicated by symbols $R2(\lambda)$, $G2(\lambda)$, and $B2(\lambda)$ exhibit the spectral sensitivity characteristics of the photoelectric conversion elements 51N on which the color filters R2, G2, and B2 are installed, respectively.

In the example shown in FIG. 3, the spectral sensitivity value at each wavelength of the wavelength range (half-value width) where the R pairs of photoelectric conversion elements 51W mainly have the spectral sensitivity is greater than that of each corresponding wavelength of the R pairs of photoelectric conversion elements 51N. Further, the half width in the spectral sensitivity characteristic $R2(\lambda)$ is narrower than that in the spectral sensitivity characteristic $R1(\lambda)$, and is located inside $R1(\lambda)$. Furthermore, the half width in the spectral sensitivity characteristic $R1(\lambda)$ falls within the wavelength range of red. Further, a ratio of the peak value to the half width in the spectral sensitivity characteristic $R1(\lambda)$ becomes greater than a ratio of the peak value to the half width of the spectral sensitivity characteristic $R2(\lambda)$. In addition, each half width in the spectral sensitivity characteristics $R1(\lambda)$ and $R2(\lambda)$ is set as a value in the wavelength range of visible light.

In the example shown in FIG. 3, the spectral sensitivity value in each wavelength of the wavelength range (half-value width) where the G pairs of photoelectric conversion elements 51W mainly have the spectral sensitivity becomes greater than that of each corresponding wavelength of the G pairs of photoelectric conversion elements 51N. Further, the half width in the spectral sensitivity characteristic $G2(\lambda)$ is narrower than that in the spectral sensitivity characteristic $G1(\lambda)$, and is located inside $G1(\lambda)$. Further, the half width in the spectral sensitivity characteristic $G1(\lambda)$ falls within the wavelength range of green. Furthermore, a ratio of the peak value to the half width of the spectral sensitivity characteristic $G1(\lambda)$ becomes greater than a ratio of the peak value to the half width of the spectral sensitivity characteristic $G2(\lambda)$.

In the example shown in FIG. 3, the spectral sensitivity value in each wavelength of the wavelength range (half-value width) where the B pairs of photoelectric conversion elements 51W mainly have the spectral sensitivity becomes greater than that of each corresponding wavelength of the B pair of photoelectric conversion elements 51N. Further, the half width in the spectral sensitivity characteristic $B2(\lambda)$ is narrower than that in the spectral sensitivity characteristic $B1(\lambda)$, and is located inside $B1(\lambda)$. Furthermore, the half width in the spectral sensitivity characteristic $B1(\lambda)$ falls within the wavelength range of blue. A ratio of the peak value to the half width of the spectral sensitivity characteristic $B1(\lambda)$ becomes greater than a ratio of the peak value to the half width of the spectral sensitivity characteristic $B2(\lambda)$. In addition, the half width in each of the spectral sensitivity characteristics $B1(\lambda)$ and $B2(\lambda)$ is set as a value in the wavelength range of visible light.

The conditions (1) to (5) can be met by providing the spectral sensitivity characteristics shown in FIG. 3 in this way.

A plurality of vertical charge transfer paths 54 are provided to correspond to the respective photoelectric conversion element lines one by one, and transfer a charge read from each photoelectric conversion element of the corresponding photoelectric conversion element lines in the column direction Y.

The vertical charge transfer units 54 are made up of charge transfer channels 54a formed within a semiconductor substrate, and transfer electrodes V1 to V8 arranged in parallel above the channels in the column direction Y. The transfer electrodes V1 to V8 are configured to be supplied with drive pulses from the imaging device driving unit 10 and the vertical charge transfer units 54 are driven by the drive pulses.

Charge read-out regions 56 (which are schematically depicted by arrows in FIG. 2) are formed between the charge transfer channels 54a and the photoelectric conversion elements of the photoelectric conversion element lines corresponding to the channels.

The transfer electrodes V3 also cover the charge read-out regions 56 of the photoelectric conversion elements 51W of odd-number lines counting from an end (upper end) opposite to the side at which the horizontal charge transfer unit 52 of the solid-state imaging device 5 is installed among the first group of photoelectric conversion elements 51W, and also serve as read-out electrodes for reading charges from these photoelectric conversion elements 51W.

The transfer electrodes V7 also cover the charge read-out regions 56 of the photoelectric conversion elements 51W of even-number lines counting from the upper end of the solid-state imaging device 5 among the first group of photoelectric conversion elements 51W, and also serve as read-out electrodes for reading charges from these photoelectric conversion elements 51W.

The transfer electrodes V5 also cover the charge read-out regions 56 of the photoelectric conversion elements 52N of odd-number lines counting from the upper end of the solid-state imaging device 5 among the second group of photoelectric conversion elements 52N, and also serve as read-out electrodes for reading charges from these photoelectric conversion elements 52N.

The transfer electrodes V1 also cover the charge read-out regions 56 of the photoelectric conversion elements 52N of even-number lines counting from the upper end of the solid-state imaging device 5 among the second group of photoelectric conversion elements 52N, and also serve as read-out electrodes for reading charges from these photoelectric conversion elements 52N.

The horizontal charge transfer unit 52 transfers the charges, which are transferred from the plurality of vertical charge transfer units 54, in the row direction X.

The output unit 53 converts the charges, which are transferred from the horizontal charge transfer unit 52, into a signal corresponding to the amount of the charges, and output the signal.

The photoelectric conversion element 51W in a pair has a wide spectral sensitivity characteristic, of which the half width is wider than that of photoelectric conversion element 51N in the corresponding pair. For this reason, a signal obtained from the first group of photoelectric conversion elements 51W may be, hereinafter, referred to as a wide signal. Further, the photoelectric conversion element 51N in a pair has a narrow spectral sensitivity characteristic, of which the half width is narrower than that of the photoelectric conversion element 51W in the corresponding pair. For this reason, a signal obtained from the second group of photoelectric conversion elements 51N may be, hereinafter, referred to as a narrow signal.

The digital camera configured as described above is adapted to switch three modes of a wide D range imaging mode, a high-resolution imaging mode, and a high-sensitivity imaging mode in response to a scene or manually.

The wide D range imaging mode means a mode in which the exposure times of the first and second groups are different from each other, and pixel data corresponding to the corresponding pairs are produced using the signals with different sensitivities, which are obtained from the photoelectric conversion elements 51W and 51N forming pairs. In this mode, the digital signal processing unit 17 combines, for example, a wide signal and a narrow signal (or combines image data generated from the wide signal and image data generated from the narrow signal), thereby, expanding the dynamic range and producing image data of which the color reproducibility is improved. In addition, the combination processing may be performed by mixing the charges read from the paired photoelectric conversion element 51W and the charges read from the photoelectric conversion element 51N in the horizontal charge transfer unit.

The high-resolution imaging mode means a mode in which the exposure times of the first and second groups are equal to each other, and pixel data corresponding to each of the photoelectric conversion elements is generated from the signal obtained from each of the photoelectric conversion elements included in the solid-state imaging device 5.

The high-sensitivity imaging mode refers to a mode in which the exposure times of the first and second groups are equal to each other, and the signals obtained from the photoelectric conversion elements 51W and 51N forming pairs are combined to generate high-sensitivity pixel data corresponding to the corresponding pairs.

Thus, with this digital camera, at the time of the wide D range imaging mode, the imaging device driving unit 10 switchably performs a first control (wide-preferred pattern), in which the exposure time of the first group of photoelectric conversion elements 51W is longer than that of the second group of photoelectric conversion elements 51N, and a second control (narrow-preferred pattern), in which the exposure time of the second group of photoelectric conversion elements 51N is longer than that of the first group of photoelectric conversion elements 51W.

Figure 4:
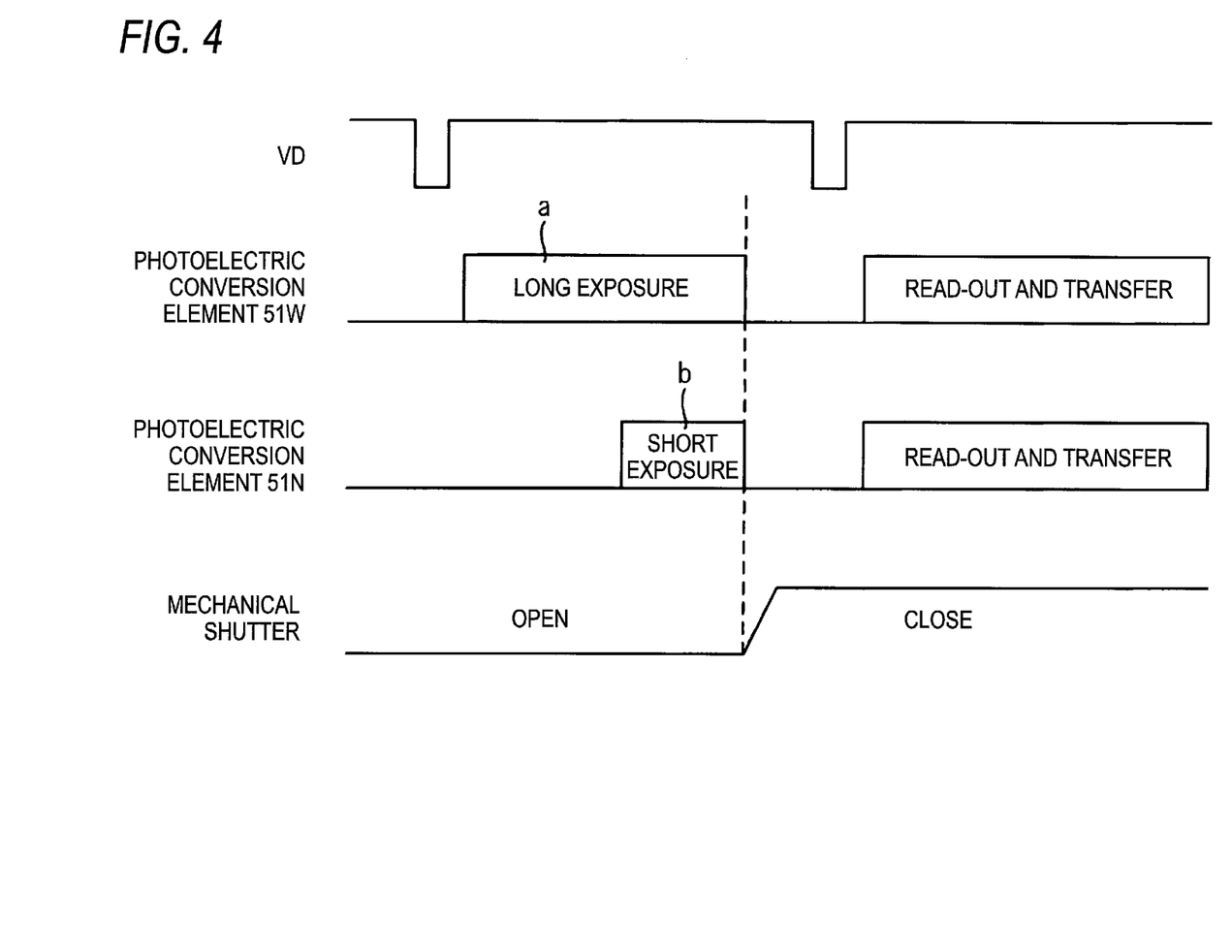
FIG. 4 is a view for describing control contents of a wide priority pattern which the imaging device driving unit in the digital camera shown in FIG. 1 performs.

FIG. 4 is a view for describing control contents of the wide priority pattern which the imaging device driving unit 10 in the digital camera shown in FIG. 1 performs.

In the wide-preferred pattern, when an imaging instruction is present, the imaging device driving unit 10 keeps a mechanical shutter (mech-shutter) open, and stops a supply of an electronic shutter pulse which has been applied to the semiconductor substrate of the solid-state imaging device 5 by that time. With the stop of the electronic shutter pulse, an exposure period a of each photoelectric conversion element 51W is initiated. Next, during the exposure period a, the imaging device driving unit 10 applies an read-out pulse to the transfer electrodes V1 and V5, and reads charges from the photoelectric conversion elements 51N to the vertical charge transfer units 54. When the application of the read-out pulse is stopped, an exposure period b of each photoelectric conversion elements 51N is initiated.

After the exposure period b is initiated, the imaging device driving unit 10 applies a pulse to the transfer electrodes V1 to V8 to perform transmission for sweeping off the read charges from each of the photoelectric conversion elements 51.

Next, when the exposure period reaches a timing of termination, the imaging device driving unit 10 closes the mechanical shutter. As such, the exposure period is terminated, and the exposure period b is also terminated at the same time.

Thereafter, the imaging device driving unit 10 applies the read-out pulse to the transfer electrodes V1, V3, V5 and V7, and reads the charges from the respective photoelectric conversion elements 51W and 51N to the vertical charge transfer units 54. Subsequently, the imaging device driving unit 10 applies a pulse to the transfer electrodes V1 to V8, and outputs signals, which correspond to the charges read from the respective photoelectric conversion elements 51W and 51N, from the solid-state imaging device 5.

Like this, the wide preferred pattern is the control that drives the solid-state imaging device 5 to expose the first group of photoelectric conversion elements 51W for a length of time longer than that of the second group of photoelectric conversion elements 51N.

Figure 5:
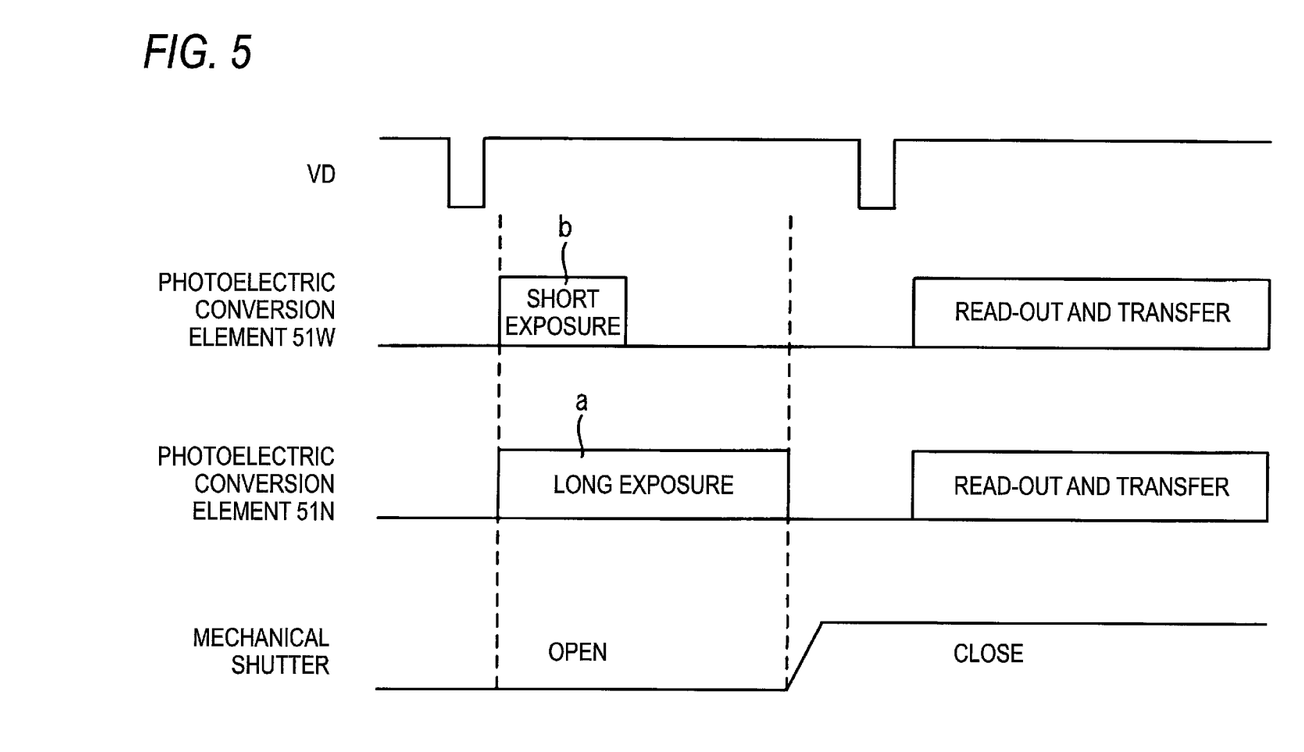
FIG. 5 is a view for describing control contents of a narrow priority pattern which the imaging device driving unit in the digital camera shown in FIG. 1 performs.

FIG. 5 is a view for describing control contents of the narrow priority pattern which the imaging device driving unit 10 in the digital camera shown in FIG. 1 performs.

In the narrow preferred pattern, when an imaging instruction is present, the imaging device driving unit 10 keeps a mechanical shutter open, and stops a supply of an electronic shutter pulse which has been applied to the semiconductor substrate of the solid-state imaging device 5 by that time. With the stop of the electronic shutter pulse, an exposure period of each of the photoelectric conversion elements 51N and an exposure period b of each of the photoelectric conversion elements 51W are initiated at the same time.

Next, during the exposure period a, the imaging device driving unit 10 applies an read-out pulse to the transfer electrodes V3 and V7, and reads charges from the photoelectric conversion elements 51W to the vertical charge transfer units 54. When the application of the read-out pulse is stopped, the exposure period b of each of the photoelectric conversion elements 51W is terminated.

Next, when the exposure period reaches a timing of termination, the imaging device driving unit 10 closes the mechanical shutter. As such, the exposure period is terminated.

Thereafter, the imaging device driving unit 10 applies the read-out pulse to the transfer electrodes V1 and V5, and reads the charges from the photoelectric conversion elements 51N to the vertical charge transfer units 54. Subsequently, the imaging device driving unit 10 applies a pulse to the transfer electrodes V1 to V8, and outputs signals, which correspond to the charges read from the photoelectric conversion elements 51W and 51N, from the solid-state imaging device 5.

Like this, the narrow-preferred pattern is the control that drives the solid-state imaging device 5 to expose the second group of photoelectric conversion elements 51N for a length of time longer than that of the first group of photoelectric conversion elements 51W.

When the wide-preferred pattern is performed, the wide D range of image data can be generated based on the wide signals obtained from the first group of photoelectric conversion elements 51W. The photoelectric conversion elements 51W of the first group are elements that have a relatively wide wavelength range where they mainly have the spectral sensitivity. For this reason, in the case of a subject such as a person including a skin color, the skin color can be faithfully reproduced by performing the combination processing based on the wide signals from these elements is performed. The spectral characteristic of the first group of photoelectric conversion elements 51W has an advantage in that stabilized color reproducibility can be obtained without relying on a light source because the spectral characteristic has a wide spectrum. Further, this spectral characteristic has an advantage in that high sensitivity and low noise can be realized because the light absorption amount is large. For this reason, in the case of the subject including a person, it is effective to perform the combination processing based on the wide signals in order to obtain the stabilized color reproducibility, the high sensitivity, and the low noise.

On the other hand, when the narrow-preferred pattern is performed, the wide D range of image data can be generated based on the narrow signals obtained from the photoelectric conversion elements 51N of the second group. The photoelectric conversion elements 51N of the second group are elements that have a relatively narrow wavelength range where they mainly have the spectral sensitivity. For this reason, in the case of a subject including a colorful region, the colorful region can be faithfully reproduced by performing the combination processing based on the narrow signals from these elements is performed. The spectral characteristic of the second group of photoelectric conversion elements 51N has an advantage of good color discrimination and a wide color reproduction region because due to the amount of light absorption amount is small. For this reason, in the case of a colorful scene, such as a landscape, it is effective to perform the combination processing based on the narrow signals in order to increase the color reproduction region.

Like this, the wide-preferred pattern can obtain a good quality of image, especially in the case of the scene of the subject including a person, whereas the narrow-preferred pattern can obtain a good quality of image, especially in the case of the scene of the subject not including a person, such as a landscape or a nightscape.

Thus, in the digital camera, the system control unit 11 has a function of determining the subject scene, and at the time of the wide D range imaging mode, the imaging device driving unit 10 switches the wide-preferred pattern and the narrow priority pattern on the basis of the result of the determination.

When the face is detected by a face detecting unit 19, the system control unit 11 determines that the subject scene is a scene including a face, and when the face is not detected by the face detecting unit 19, the system control unit 11 determines that the subject scene to be a scene not including the face.

When the subject scene is the scene including the face, the imaging device driving unit 10 drives the solid-state imaging device 5 in the wide priority pattern, and when the subject scene is the scene not including the face, the imaging device driving unit 10 drives the solid-state imaging device 5 in the narrow priority pattern.

Hereinafter, an operation of the digital camera illustrated in FIG. 1 in the wide D range imaging mode will be described.

Figure 6:
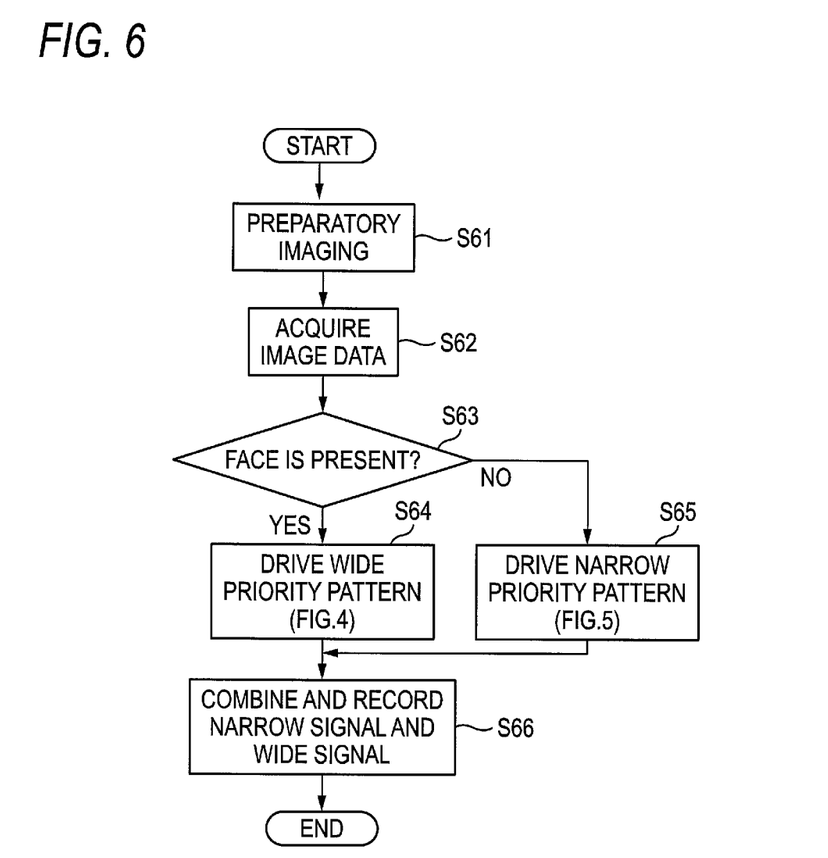
FIG. 6 is a flow chart for describing an operation of the digital camera shown in FIG. 1 in a wide D range imaging mode.

FIG. 6 is a flow chart for describing an operation of the digital camera shown in FIG. 1 in the wide D range imaging mode.

When a shutter button included in the operation unit 14 is pushed halfway, the system control unit 11 performs a preparatory imaging for carrying out AE (automatic exposure control) and AF (automatic focusing control) by means of the solid-state imaging device 5 (step S61), and performs the AE and AF to decide imaging conditions.

Next, the face detecting unit 19 acquires image data obtained by the preparatory imaging (step S62), and performs face detection processing on the image data.

When a face is detected from the corresponding image data (YES at step S63), the face detecting unit 19 notifies the system control unit 11 of this effect. The system control unit 11 receives this notification, and sets the control to be performed by the imaging device driving unit 10 to the wide-preferred pattern. Then, when the shutter button is fully pushed, the solid-state imaging device 5 is driven according to the wide-preferred pattern by the imaging device driving unit 10 (step S64).

When the face is not detected from the corresponding image data (NO at step S63), the face detecting unit 19 notifies the system control unit 11 of this effect. The system control unit 11 receives this notification, and sets the control to be performed by the imaging device driving unit 10 to the narrow-preferred pattern. Then, when the shutter button is fully pushed, the solid-state imaging device 5 is driven according to the narrow-preferred pattern by the imaging device driving unit 10 (step S65).

Wide signals and narrow signals output from the solid-state imaging device 5 by driving steps S64 and S65 are temporarily stored in the main memory 16. Then, the digital signal processing unit 17 combines these signals to generate wide D range image data, and records it in the recording medium 21 (step S66).

As described above, according to the digital camera, when the face is included in the subject, the solid-state imaging device 5 can be driven according to the wide-preferred pattern and when the face is not included in the subject, the solid-state imaging device 5 can be driven according to the narrow-preferred pattern. For this reason, it is possible to perform imaging in an optimal pattern depending on the subject, and to obtain an optimal quality of image corresponding to the subject. In the digital camera, all the photoelectric conversion elements of the solid-state imaging device 5 are adapted to have approximately the same configuration, and the exposure times of the first and second groups are adapted to be independently controlled. As such, the sensitivity of the signals obtained from the first group and the sensitivity of the signal obtained from the second group are adapted to be switched. If the first group of photoelectric conversion elements and the second group of photoelectric conversion elements are configured so that the configurations thereof are differentiated (for instance, light-shielding film opening sizes are differentiated) to obtain the signals, which have different sensitivities, respectively, from the first group and the second group, a fixed sensitivity difference is structurally given. As such, it is difficult to perform the driving as described above to obtain the optimal quality of image. For this reason, it is desirable to configure all the photoelectric conversion elements of the solid-state imaging device 5 to have approximately the same construction in performing the driving described above to obtain the optimal quality of image corresponding to the subject.

Further, according to the digital camera, the wavelength range where the photoelectric conversion elements 51N of the pairs mainly have the spectral sensitivity is completely included in the wavelength range where the corresponding photoelectric conversion elements 51W of the corresponding pairs mainly have the spectral sensitivity. For this reason, a correlation between the narrow signal and the wide signal can be increased, and high-quality wide D range image data can be generated.

In the description above, the subject scene is allowed to be determined based on whether a face is present or not, but is not limited thereto. For example, when a plurality of modes, such as a portrait mode, a landscape mode, and a nightscape mode, are set in the digital camera, the subject scene may be determined on the basis of a mode set by a user. For example, when the portrait mode is set, the wide-preferred pattern may be preferably performed by determining the subject scene as a scene including a face. Further, when a mode other than the portrait mode is set, the narrow-preferred pattern may be preferably performed by determining the subject scene as a scene not including the face. In this case, when the face is detected, even though a mode other than the portrait mode is set, the wide-preferred pattern may be allowed to be performed.

Further, in the description above, the photoelectric conversion elements 51W and the photoelectric conversion elements 51N adjacent to one another in the same positional relationship are adapted to meet the aforementioned conditions (1) to (5). However, the elements may meet at least the conditions (1) to (3) in order to make it possible to obtain the image quality suitable for the scene including the face and the image quality suitable for the scene not including the face.

This is because when the condition (1) is not met, the effect of improving the color reproducibility cannot be obtained, and when the condition (2) is not met, the correlation between the signals obtained from the pair is reduced. In addition, this is because the image quality suitable for both the scene including the face and the scene not including the face cannot be obtained when the condition (3) is not met. However, when the condition (4) is met, the image quality can be further improved. Further, when the condition (5) is met, the image quality can be further improved.

Further, in terms of the purpose of obtaining two image qualities having different tones in one solid-state imaging device 5, it may be desirable if at least the conditions (1) and (2) among the conditions (1) to (5) are met.

If the conditions (1) and (2) are met, the image data having different tones can be obtained with the driving illustrated in FIG. 4 and the driving illustrated in FIG. 5. In this case, for example, two modes capable of obtaining the image qualities having different tones are set for the digital camera, and the driving shown in FIG. 4 is matched to one of the two modes, whereas the driving shown in FIG. 5 is matched to the other mode. Then, the driving corresponding to the set mode may be performed.

Further, these two modes may also be configured in such a manner that the camera can automatically set the optimal mode depending on the subject scene. For example, even in the landscape mode, an optimal tone exists depending on the contents of configuration of the landscape. As such, if the subject scene is determined to perform the driving capable of obtaining the optimal tone, a mere landscape is also allowed to obtain the image quality suitable for its contents.

Further, as the method of differentiating the spectral sensitivity characteristics in the photoelectric conversion elements 51W and the photoelectric conversion elements 51N forming pairs, the following method may be employed.

That is, the spectral sensitivity characteristics of the color filter R1 and the color filter R2 are made to be equal to each other, the spectral sensitivity characteristics of the color filter G1 and the color filter G2 are made to be equal to each other, and the spectral sensitivity characteristics of the color filter B1 and the color filter B2 are made to be equal to each other. In addition, the pair of photoelectric conversion elements 51W and 51N are made to be different in structure, so that a difference in spectral sensitivity characteristic is provided between the photoelectric conversion elements 51W and 51N. For example, there is a method of changing a depth of a pn junction face of the photodiode constituting the photoelectric conversion element 51W among the photoelectric conversion elements 51W and 51N forming pairs, and a depth of a pn junction face of the photodiode constituting the photoelectric conversion element 51N.

Figure 7:
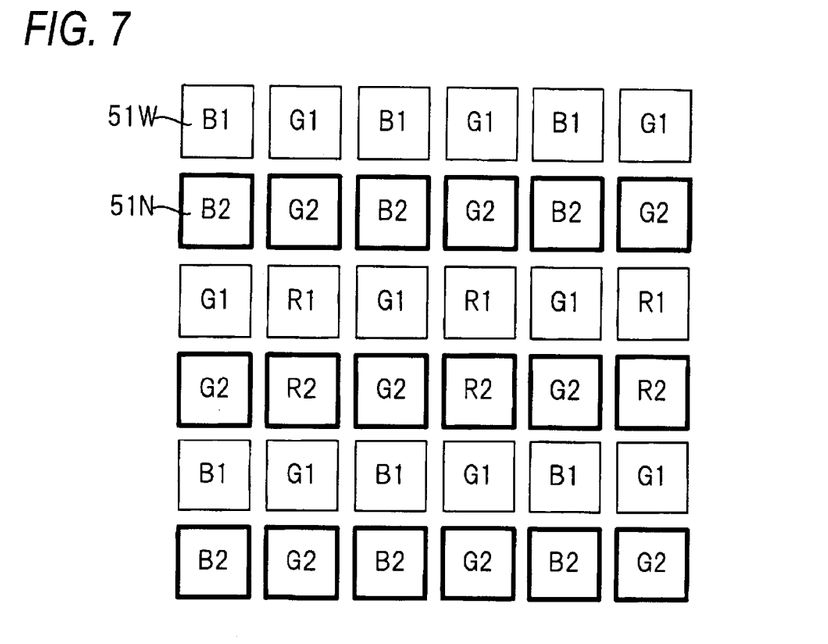
FIG. 7 is a view showing a modification of the solid-state imaging device shown in FIG. 2.
Figure 8:
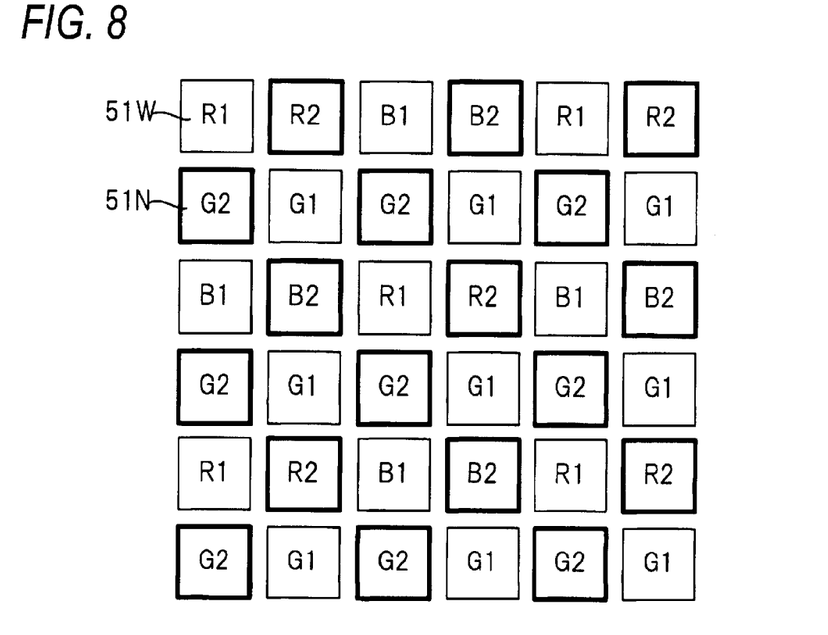
FIG. 8 is a view showing a modification of the solid-state imaging device shown in FIG. 2.

Further, the array of the photoelectric conversion elements 51W and 51N of the solid-state imaging device 5 may be formed as illustrated in FIGS. 7 and 8.

FIG. 7 is a view illustrating a modification of the solid-state imaging device shown in FIG. 2. The solid-state imaging device of this modification is configured to arrange a plurality of photoelectric conversion elements in a square lattice shape in which odd-number lines of them are set as the photoelectric conversion elements 51W and even-number lines are set as the photoelectric conversion elements 51N.

FIG. 8 is a view illustrating a modification of the solid-state imaging device shown in FIG. 2. The solid-state imaging device of this modification is configured to arrange a plurality of photoelectric conversion elements in a square lattice shape, in which the photoelectric conversion elements 51W are disposed at one-side check pattern positions of them, and the photoelectric conversion elements 51N are at the other-side check pattern positions.

Even in the array as illustrated in FIG. 7, it is possible to achieve an improvement of color reproducibility by treating each photoelectric conversion element 51W and a photoelectric conversion element 51N adjacent to each photoelectric conversion element W in the same positional relationship (in the same direction) as a pair. Further, even in the array as illustrated in FIG. 8, it is possible to try to improve the color reproducibility by treating each photoelectric conversion element 51W and a photoelectric conversion element 51N adjacent to each photoelectric conversion element W in the same positional relationship (in a rightward direction) as a pair in the odd-number lines, and treating each photoelectric conversion element 51W and a photoelectric conversion element 51N adjacent to each photoelectric conversion element W in the same positional relationship (in a leftward direction) as a pair in the even-number lines.

In the description above, the solid-state imaging device 5 is adapted to have the three types of pairs, and to detect three primary colors of R, G, and B using the three types of pairs, but it is not limited to this. For example, complementary colors of cyan, magenta, and yellow may be configured to be detected using the three types of pairs, respectively. Further, the pairs are not limited to the three types. If at least two types of pairs are present, color imaging can be performed.

Further, the solid-state imaging device 5 is not limited to the CCD type, and it may be a metal oxide semiconductor (MOS) type. In this case, as disclosed in Japanese Unexamined Patent Application Publication No. 2007-124137, a scanning circuit and a correlated double sampling (CDS) circuit may be separately installed in the first group and the second group. Further, in this case, only signal amplification processing may be adapted to be performed in the analog signal processing unit 6.

As described above, the following matters are disclosed herein.

The disclosed imaging apparatus includes: a solid-state imaging device that has a plurality of pairs of first and second photoelectric conversion elements having different spectral sensitivity characteristics; and a driving unit that independently controls the exposure time of a first group made up of the plurality of first photoelectric conversion elements and the exposure time of a second group made up of the plurality of second photoelectric conversion elements, wherein a wavelength range where the first photoelectric conversion element of each pair mainly has a spectral sensitivity and a wavelength range where the second photoelectric conversion element of each pair mainly has a spectral sensitivity fall within the respective wavelength ranges of specific colors of visible light, the plurality of pairs include a plurality of types of pairs having different specific colors, and the driving unit switchably performs a first control in which the exposure time of the first group is longer than that of the second group, and a second control in which the exposure time of the second group is longer than that of the first group.

With this configuration, the first control and the second control can be switchably performed. Further, tones obtained by the first control and the second control can be changed. For this reason, for example, it becomes possible to select and perform a control that enables obtaining an optimal tone corresponding to a subject, and the color reproducibility can be improved.

In the disclosed imaging apparatus, the driving unit switches the first control and the second control depending on a subject scene.

With this configuration, an optimal image quality corresponding to the subject scene can be obtained.

The disclosed imaging apparatus is configured such that a half width in the spectral sensitivity characteristic of the first photoelectric conversion element of each pair is wider than a half width in the spectral sensitivity characteristic of the second photoelectric conversion element of the pair.

With this configuration, an image quality suitable for a colorful subject and an image quality suitable for a subject other than the colorful subject can be obtained, and these can be switched and obtained depending on the subject scene.

The disclosed imaging apparatus is configured such that the spectral sensitivity of the first photoelectric conversion element of each pair at each wavelength in the wavelength range where the first photoelectric conversion element mainly has the spectral sensitivity is higher than the spectral sensitivity at the each wavelength of the second photoelectric conversion element in the pair With this configuration, the image quality can be further improved.

The disclosed imaging apparatus is configured such that the driving unit selects the first control in a case of the subject scene in which a face is included in the subject, and selects the second control in a case of the subject scene in which the face is not included in the subject.

With this configuration, it is possible to obtain an image quality most suitable for each of a scene that includes a face and a scene that does not include a face.

The disclosed imaging apparatus is configured such that the solid-state imaging device includes color filters installed above each of the first photoelectric conversion elements and above each of the second photoelectric conversion elements and a difference in spectral sensitivity characteristic between the first and second respective photoelectric conversion element in each pair is obtained according to a difference in spectral sensitivity characteristic between the respective color filters above the first and second photoelectric conversion elements.

With this configuration, a degree of freedom can be given such that there is provided a difference in spectral sensitivity characteristic between the first and second photoelectric conversion elements.

The disclosed imaging apparatus is configured such that each of the first photoelectric conversion elements and each of the second photoelectric conversion elements are disposed such that a plurality of first photoelectric conversion element lines in which the first photoelectric conversion elements are arranged in parallel in a column direction and a plurality of second photoelectric conversion element lines in which the second photoelectric conversion elements are arranged in parallel in the column direction are alternately arranged in parallel in a row direction intersecting the column direction, the second photoelectric conversion element lines are disposed to be offset with respect to the first photoelectric conversion element lines in the column direction by a half of an array pitch in the column direction of the first photoelectric conversion elements and the second photoelectric conversion elements, and the first photoelectric conversion elements and the second photoelectric conversion elements adjacent to the first photoelectric conversion elements in the same positional relationship form the pairs.

The disclosed imaging apparatus is configured such that all the first and second photoelectric conversion elements included in the solid-state imaging device have approximately the same configuration.

The disclosed method of driving a solid-state imaging device is a method of driving a solid-state imaging device having a plurality of pairs including first and second photoelectric conversion elements having different spectral sensitivity characteristics, wherein a wavelength range where the first photoelectric conversion element of each pair mainly has a spectral sensitivity and a wavelength range where the second photoelectric conversion element of each pair mainly has a spectral sensitivity fall within the respective wavelength ranges of specific colors of visible light, the plurality of pairs include a plurality of types of pairs having different specific colors, and the method includes a driving step of independently controlling an exposure time of a first group made up of the plurality of first photoelectric conversion elements and an exposure time of a second group made up of the plurality of second photoelectric conversion elements. In the driving step, a first control in which the exposure time of the first group is longer than that of the second group and a second control in which the exposure time of the second group is longer than that of the first group are switchably performed.

The disclosed method of driving a solid-state imaging device is configured such that the driving step includes switching the first control and the second control depending on a subject scene.

The disclosed method of driving a solid-state imaging device is configured such that a half width in the spectral sensitivity characteristic of the first photoelectric conversion element in each pair is wider than a half width in the spectral sensitivity characteristic of the second photoelectric conversion element the pair.

The disclosed method of driving a solid-state imaging device is configured such that the spectral sensitivity of the first photoelectric conversion element in each pair at each wavelength of the wavelength range where the first photoelectric conversion element in the pair mainly has the spectral sensitivity is higher than the spectral sensitivity at the each wavelength of the second photoelectric conversion element in the pair.

The disclosed method of driving a solid-state imaging device is configured such that in the driving step, when the subject scene is a scene which includes a face in the subject, the first control is selected, and when the subject scene is a scene that does not include a face in the subject, the second control is selected.

The disclosed method of driving a solid-state imaging device is configured such that the solid-state imaging device includes color filters installed above each of the first photoelectric conversion elements and above each of the second photoelectric conversion elements, and a difference between the spectral sensitivity characteristics of each paired first photoelectric conversion element and the second photoelectric conversion element is obtained according to a difference between spectral sensitivity characteristics of the respective color filters above the first and second photoelectric conversion elements.

In the disclosed method of driving a solid-state imaging device, is configured such that each of the first photoelectric conversion elements and each of the second photoelectric conversion elements are disposed such that a plurality of first photoelectric conversion element lines in which the first photoelectric conversion elements are arranged in parallel in a column direction and a plurality of second photoelectric conversion element lines in which the second photoelectric conversion elements are arranged in parallel in the column direction are alternately arranged in parallel in a row direction intersecting the column direction, the second photoelectric conversion element lines are disposed to be offset with respect to the first photoelectric conversion element lines in the column direction by a half of an array pitch in the column direction of the first photoelectric conversion elements and the second photoelectric conversion elements, and the first photoelectric conversion elements and the second photoelectric conversion elements adjacent to the first photoelectric conversion elements in the same positional relationship form the pairs.

The disclosed method of driving a solid-state imaging device is configured such that all the first and second photoelectric conversion elements included in the solid-state imaging device have approximately the same configuration.

INDUSTRIAL APPLICABILITY

According to the present invention, it is possible to provide an imaging apparatus and a method of driving a solid-state imaging device which are capable of achieving the improvement of color reproducibility and the expansion of a dynamic range regardless of a subject.

While the present invention has been described in detail or with reference to specific embodiments, it is apparent from those skilled in the art that various modifications or corrections can be made without departing from a spirit and scope of the present invention.

This application claims priority to and the benefits of Japanese Patent Application No. 2010-97366 filed on Apr., 20, 2010, the disclosure of which is incorporated herein by reference.

DESCRIPTION OF REFERENCE NUMERALS

5 solid-state imaging device
10 imaging device driving unit
51W, 51N photoelectric conversion element

The invention claimed is:
1. An imaging apparatus comprising:
a solid-state imaging device that has a plurality of pairs of first and second photoelectric conversion elements having different spectral sensitivity characteristics; and
a driving unit that independently controls an exposure time of a first group made up of the plurality of first photoelectric conversion elements and an exposure time of a second group made up of the plurality of second photoelectric conversion elements,
wherein a wavelength range where the first photoelectric conversion element of each pair mainly has a spectral sensitivity and a wavelength range where the second photoelectric conversion element of each pair mainly has spectral sensitivity fall within the respective wavelength ranges of specific colors of visible light,
a half width in the spectral sensitivity characteristic of each first photoelectric conversion element of the pair is wider than a half width in the spectral sensitivity characteristic of each second photoelectric conversion element of the pair,
the plurality of pairs include a plurality of types of pairs having different specific colors, the driving unit switchably performs the first control in a case of the subject scene in which a face is included in the subject,
the driving unit performs the second control in a case of the subject scene in which the face is not included in the subject,
the first control correspond to a control in which the exposure time of the first group is longer than that of the second group, and
the second control correspond to a control in which the exposure time of the second group is longer than that of the first group.

2. The imaging apparatus according to claim 1, wherein the spectral sensitivity of each first photoelectric conversion element of each pair at the each wavelength in the wavelength range where first photoelectric conversion element mainly has the spectral sensitivity is higher than the spectral sensitivity at the each wavelength of each second photoelectric conversion element in the pair.

3. The imaging apparatus according to claim 1, wherein:
the solid-state imaging device includes color filters installed above each of the first photoelectric conversion elements and above each of the second photoelectric conversion elements; and
a difference in the spectral sensitivity characteristic between the first and the second photoelectric conversion elements in each pair is obtained according to a difference in spectral sensitivity characteristic between the respective color filters above the first and second photoelectric conversion elements.

4. The imaging apparatus according to claim 1, wherein:
each of the first photoelectric conversion elements and each of the second photoelectric conversion elements are disposed such that a plurality of first photoelectric conversion element lines in which the first photoelectric conversion elements are arranged in parallel in a column direction and a plurality of second photoelectric conversion element lines in which the second photoelectric conversion elements are arranged in parallel in the column direction are alternately arranged in parallel in a row direction intersecting the column direction;
the second photoelectric conversion element lines are disposed to be offset with respect to the first photoelectric conversion element lines in the column direction by a half of an array pitch in the column direction of the first photoelectric conversion elements and the second photoelectric conversion elements; and
the first photoelectric conversion elements and the second photoelectric conversion elements adjacent to the first photoelectric conversion elements in the same positional relationship form the pairs.

5. The imaging apparatus according to claim 1, wherein all the first and second photoelectric conversion elements included in the solid-state imaging device have approximately the same configuration.

6. A method of driving a solid-state imaging device having a plurality of pairs including first and second photoelectric conversion elements having different spectral sensitivity characteristics,
wherein a wavelength range where first photoelectric conversion element of each pair mainly has a spectral sensitivity and a wavelength range where second photoelectric conversion element of each pair mainly has spectral sensitivity fall within the respective wavelength ranges of specific colors of visible light,
a half width in the spectral sensitivity characteristic of each first photoelectric conversion element of the pair is wider than a half width in the spectral sensitivity characteristic of each second photoelectric conversion element of the pair, the plurality of pairs include a plurality of types of pairs having different specific colors, the method includes a driving step of independently controlling an exposure time of a first group made up of the plurality of first photoelectric conversion elements and an exposure time of a second group made up of the plurality of second photoelectric conversion elements, the driving step includes performing first control in a case of the subject scene in which a face is included in the subject, and performing second control in a case of the subject scene in which the face is not included in the subject, the first control corresponds to a control in which the exposure time of the first group is longer than that of the second group, and the second control corresponds to a control in which the exposure time of the second group is longer than that of the first group.

7. The method according to claim 6, wherein the spectral sensitivity of each first photoelectric conversion element of each pair at the each wavelength in the wavelength range where the first photoelectric conversion element mainly has the spectral sensitivity is higher than the spectral sensitivity at the each wavelength of each second photoelectric conversion element in the pair.

8. The method according to claim 6, wherein:

the solid-state imaging device includes color filters installed above each of the first photoelectric conversion elements and above each of the second photoelectric conversion elements; and a difference in the spectral sensitivity characteristic between the first and the second photoelectric conversion elements in each pair is obtained according to a difference in spectral sensitivity characteristic between the respective color filters above the first and second photoelectric conversion elements.

9. The method according to claim 6, wherein:

each of the first photoelectric conversion elements and each of the second photoelectric conversion elements are disposed such that a plurality of first photoelectric conversion element lines in which the first photoelectric conversion elements are arranged in parallel in a column direction and a plurality of second photoelectric conversion element lines in which the second photoelectric conversion elements are arranged in parallel in the column direction are alternately arranged in parallel in a row direction intersecting the column direction;

the second photoelectric conversion element lines are disposed to be offset with respect to the first photoelectric conversion element lines in the column direction by a half of an array pitch in the column direction of the first photoelectric conversion elements and the second photoelectric conversion elements; and the first photoelectric conversion elements and the second photoelectric conversion elements adjacent to the first photoelectric conversion elements in the same positional relationship form the pairs.

10. The method according to claim 6, wherein all the first and second photoelectric conversion elements included in the solid-state imaging device have approximately the same configuration.

* * * * *